United States Patent
Tanabe

(10) Patent No.: US 7,711,024 B2
(45) Date of Patent: May 4, 2010

(54) MONOLITHIC SEMICONDUCTOR LASER

(75) Inventor: Tetsuhiro Tanabe, Kyoto (JP)

(73) Assignee: Rohm Co., Ltd., Kyoto-shi (JP)

( * ) Notice: Subject to any disclaimer, the term of this patent is extended or adjusted under 35 U.S.C. 154(b) by 28 days.

(21) Appl. No.: 11/990,859

(22) PCT Filed: Aug. 23, 2006

(86) PCT No.: PCT/JP2006/316475
§ 371 (c)(1),
(2), (4) Date: Feb. 22, 2008

(87) PCT Pub. No.: WO2007/023844
PCT Pub. Date: Mar. 1, 2007

(65) Prior Publication Data
US 2009/0034569 A1   Feb. 5, 2009

(30) Foreign Application Priority Data
Aug. 24, 2005   (JP) .............................. 2005-242326

(51) Int. Cl.
*H01S 5/00* (2006.01)
(52) U.S. Cl. ............................ 372/45.011; 372/50.121; 372/43.01
(58) Field of Classification Search ............ 372/45.011, 372/50.121, 43.01
See application file for complete search history.

(56) References Cited

U.S. PATENT DOCUMENTS

| | | | |
|---|---|---|---|
| 6,618,420 B1 | 9/2003 | Gen-Ei et al. | |
| 6,738,402 B1* | 5/2004 | Hosoda et al. | 372/43.01 |
| 2001/0019567 A1* | 9/2001 | Orita et al. | 372/46 |
| 2003/0012241 A1 | 1/2003 | Onishi | |
| 2003/0042492 A1 | 3/2003 | Watanabe | |
| 2004/0062285 A1 | 4/2004 | Uchizaki et al. | |
| 2005/0008054 A1 | 1/2005 | Ukai | |
| 2005/0069005 A1 | 3/2005 | Nishida et al. | |

FOREIGN PATENT DOCUMENTS

| | | |
|---|---|---|
| JP | 2000-011417 | 1/2000 |
| JP | 2001-203423 | 7/2001 |
| JP | 2001-345514 | 12/2001 |
| JP | 2002-111136 | 4/2002 |
| JP | 2002-197707 | 7/2002 |

* cited by examiner

*Primary Examiner*—Minsun Harvey
*Assistant Examiner*—Patrick Stafford
(74) *Attorney, Agent, or Firm*—Rabin & Berdo, PC

(57) ABSTRACT

There is disclosed a monolithic semiconductor laser which is provided with an AlGaAs based semiconductor laser element (10a) and an InGaAlP based semiconductor laser element (10b) formed on a semiconductor substrate (1). The AlGaAs based semiconductor laser element (10a) is composed of an infrared light emitting layer forming portion (9a), which has an n-type cladding layer (2a), an active layer (3a) and a p-type cladding layer (4a) formed so as to have a ridge portion, and a current constriction layer (5a) provided on sides of the ridge portion, while the InGaP based semiconductor laser element (10b) is composed of a red light emitting layer forming portion (9a), which has an n-type cladding layer (2b), an active layer (3b) and a p-type cladding layer (4b) formed so as to have a ridge portion, and a current constriction layer (5b) provided on sides of the ridge portion. The current constriction layers of the both elements are made of the same material having a larger band gap than that of the active layer (3b) of the red light emitting layer forming portion. Consequently, there can be obtained a monolithic semiconductor laser capable of high temperature and high output operation without increasing the number of processes of the growth.

6 Claims, 2 Drawing Sheets

MONOLITHIC SEMICONDUCTOR LASER

FIELD OF THE INVENTION

The present invention relates to a monolithic semiconductor laser suitable for a pickup light source of an integrated optical disk device composed of a DVD device such as a DVD (digital versatile disk), a DVD-ROM, a data writable DVD-R or the like, and a CD device such as a CD, a CD-ROM, a data writable CD-R or the like. More particularly, the present invention relates to a monolithic semiconductor laser having a structure capable of high temperature and high output operation with decreasing manhours of a manufacturing process.

BACKGROUND OF THE INVENTION

In recent years, accompanied with popularization of an optical disk device which has compatibility between a DVD and a CD, a monolithic semiconductor laser is used as a light source, which emits laser light having two wavelengths from places apart from each other with a determined interval by forming an InGaAlP based semiconductor laser element for red light and an AlGaAs based semiconductor laser element for infrared light on the same semiconductor substrate (cf. for example PATENT DOCUMENT 1).

As shown in FIG. 3, the AlGaAs based semiconductor laser element 50a is provided, on a semiconductor substrate 51 made of, for example, n-type GaAs, with, for example, an infrared light emitting layer forming portion 59a, which is composed of an n-type cladding layer 52a made of n-type AlGaAs based semiconductor, an active layer 53a made of AlGaAs based semiconductor and a p-type cladding layer 54a made of p-type AlGaAs based semiconductor and having a ridge shape, and a current constriction layer 55a for an infrared element made of n-type GaAs, which is formed on sides of the ridge portion, and a contact layer 56a made of, for example, p-type GaAs is provided thereon. On the other hand, the InGaAlP based semiconductor laser element 50b is provided, on the same semiconductor substrate 51 where the AlGaAs based semiconductor laser element 50a is formed, with, for example, an red light emitting layer forming portion 59b, which is composed of an n-type cladding layer 52b made of n-type InGaAlP based semiconductor, an active layer 53b made of InGaAlP based semiconductor and a p-type cladding layer 54b made of p-type InGaAlP based semiconductor, and a current constriction layer 55b for the red element made of n-type GaAs which is the same material as that of the current constriction layer 55a, which is formed on sides of the ridge portion, and a contact layer 56b made of, for example, p-type GaAs is provided thereon. Further, p-side electrodes 57a and 57b are formed on the contact layers 56a and 56b, and a common n-side electrode 58 is formed at a back surface side of the semiconductor substrate 51, thereby a monolithic semiconductor laser is formed in which both elements are electrically separated. PATENT DOCUMENT 1: Japanese Patent Application Laid-Open No. 2000-11417 (FIG. 9)

DISCLOSURE OF THE INVENTION

Problem to be Solved by the Present Invention

In a conventional structure, GaAs is used for current constriction layers for the infrared element and the red element, and band gap energy of each current constriction layer is smaller than that of the active layer respectively. Then, a complex refractive index waveguide structure is formed, in which the current constriction layer absorbs light emitted in the active layer, and a waveguide loss and threshold current are large, as a result, there arises a problem such that the conventional semiconductor laser can be used only for a light source for reading and can not be used for a light source for writing, because high output operation is impossible.

On the other hand, since there are well known semiconductor laser devices developed for a light source for writing, in which a real (or effective) refractive index structure is employed by using a material having a large band gap energy for a current constriction layer, a monolithic semiconductor laser can be suggested which is formed by a simple combination of those semiconductor laser elements. Concretely, it may be suggested that an AlGaAs based material is used for a current constriction layer for an infrared element side of an AlGaAs based semiconductor laser element and an InGaAlP based material for a current constriction layer for a red element side of an InGaAlP based semiconductor laser element.

However, when intending to form a monolithic laser by a simple combination of the conventional semiconductor laser elements using a real (effective) refractive index structure, it is necessary to grow each current constriction layer separately since the current constriction layers of an AlGaAs based semiconductor laser element and an InGaAlP based semiconductor laser element are made of different materials. In addition, manufacturing manhours such as etching or the like increase accompanied therewith, and there arises a problem such as extreme lowering of a manufacturing yield.

If the current constriction layers are commonized forcibly, there arise problems such that high output operation can not be obtained since light of a light emitting element of a short light wavelength is absorbed in the current constriction layer, or a kink is apt to occur since difference of a refractive index between a second conductivity type semiconductor layer of a ridge portion and the current constriction layer becomes too large.

The present invention is directed to solve the above-described problems and an object of the present invention is to provide a monolithic semiconductor laser capable of high temperature and high output operation without increasing the number of crystal growing steps.

Another object of the present invention is to provide a semiconductor laser having a structure capable of inhibiting occurrence of a kink while achieving high temperature and high output operation without increasing the number of crystal growing steps.

Means for Solving the Problem

A monolithic semiconductor laser according to the present invention includes: a semiconductor substrate; a first wavelength semiconductor laser element provided on the semiconductor substrate, the first wavelength semiconductor laser element including a first wavelength light emitting layer forming portion which includes a first conductivity type semiconductor layer, an active layer and a second conductivity type semiconductor layer which is formed so as to have a ridge portion, and a first conductivity type current constriction layer for the first wavelength semiconductor laser element provided on sides of the ridge portion of the second conductivity type semiconductor layer; and a second wavelength semiconductor laser element provided on a region of the semiconductor substrate, where the first wavelength semiconductor laser element is not formed, the second wavelength semiconductor laser element including a second wavelength light emitting layer forming portion which includes a first conductivity type semiconductor layer, an active layer and a second conductivity type semiconductor layer which is formed so as to have a ridge portion, and a first conductivity type current constriction layer for the second wavelength semiconductor laser element provided on sides of the ridge portion of the second conductivity type semiconductor layer, wherein materials forming the current constriction layers for the first and second wavelength semiconductor laser elements are the same material and the material has larger band gap energy than that of the active layer of the second wavelength semiconductor laser element which emits light of a shorter wavelength than that of the first wavelength semiconductor laser element.

Concretely, the material of the current constriction layers for the first and second wavelength semiconductor laser elements is a material represented by $Al_zGa_{1-z}As$ ($0.5 \leqq z \leqq 0.8$). In addition, the material of the current constriction layers for the first and second wavelength semiconductor laser elements is a material represented by $In_{0.5}(Ga_{1-x}Al_x)_{0.5}P$ ($0.6 \leqq x \leqq 1$).

Here, a mixed crystal ratio 0.5 of In and $(Ga_{1-x}Al_x)$ means that lattice matching with GaAs can be obtained by the ratio.

In addition, after earnest studies, it was found that, besides the above-described constitution, as each second conductivity type semiconductor layer in which the ridge portion is formed, by using a material which has a refractive index such that the difference between the refractive index and a refractive index of the current constriction layers is 0.1 or less, stable high output characteristics can be achieved even if the current constriction layers are made of the same material.

Namely, if it is intended to form a monolithic semiconductor laser having a real (effective) refractive index structure in which the same material is used for the current constriction layers of an infrared element for the first wavelength semiconductor laser element and a red element for the second wavelength semiconductor laser element, high temperature operation characteristics or high output characteristics are occasionally influenced by selection of the material for the current constriction layer. For example, if a material suitable for one semiconductor laser element is used for a current constriction layer of the other semiconductor laser element, high output characteristics can be maintained in one semiconductor laser element, however, since the material is not occasionally suitable for the other semiconductor laser element, there occur cases such that the high output characteristics deteriorates because a single mode oscillation is impossible and a multimode oscillation arises, and also the high temperature operation characteristics deteriorates.

Then, the present inventor studied widely in order to increase more the number of materials which can be used for a current constriction layer, while using a common material for the current constriction layers for a first wavelength element and a second wavelength element. Further, it was found that, as the second conductivity type semiconductor layer of each semiconductor laser element, which is a part of a ridge portion adjacent to the current constriction layer by using a material which has a refractive index such that difference between the refractive index and a refractive index of the current constriction layer is 0.1 or less, such trouble can be avoided, and a range of selection of a material which can be used for the current constriction layer capable of high temperature operation can be widened.

Therefore, the monolithic semiconductor laser according to the present invention is formed with a structure in which the second conductivity type semiconductor layers having the ridge portion of the first and second wavelength semiconductor laser elements are made of materials which have a refractive index respectively, such that the difference between the refractive index and a refractive index of the current constriction layers for the first and second wavelength semiconductor laser elements is 0.1 or less.

In addition, the current constriction layers for the first and second wavelength semiconductor laser elements are electrically separated and made with an n-type semiconductor layer which is formed by adding Si to the current constriction layer.

EFFECT OF THE INVENTION

According to the present invention, in order to form current constriction layers of a first wave length element and a second wavelength element having a shorter wavelength than that of the first wavelength device, a material which has larger band gap energy than that of an active layer of the second wavelength element is used, thereby light emitted in the active layer is not absorbed by each current constriction layer, high output operation can be achieved, and since the current constriction layers are made of the same material, there can be manufactured a monolithic semiconductor laser capable of high temperature and high output operation without increasing the number of crystal growing steps and with inhibiting lowering of manufacturing yield.

In addition, by using materials, which have refractive indices such that difference between the refractive indices and those of the current constriction layers is 0.1 or less, for each of the second conductivity type layers, it can be prevented that high output operation can not be achieved because of a multimode oscillation of one semiconductor laser element caused by changing material for the current constriction layers, and a range of selection of material which can be used for the current constriction layer can be widened, thereby a monolithic semiconductor laser capable of a single mode oscillation till high temperature and high output can be obtained.

EXPLANATION OF LETTERS AND NUMERALS

1: semiconductor substrate
5*a*: current constriction layer for infrared
5*b*: current constriction layer for red
9*a*: infrared light emitting layer forming portion
9*b*: red light emitting layer forming portion

THE BEST EMBODIMENT OF THE PRESENT INVENTION

Figure 1:
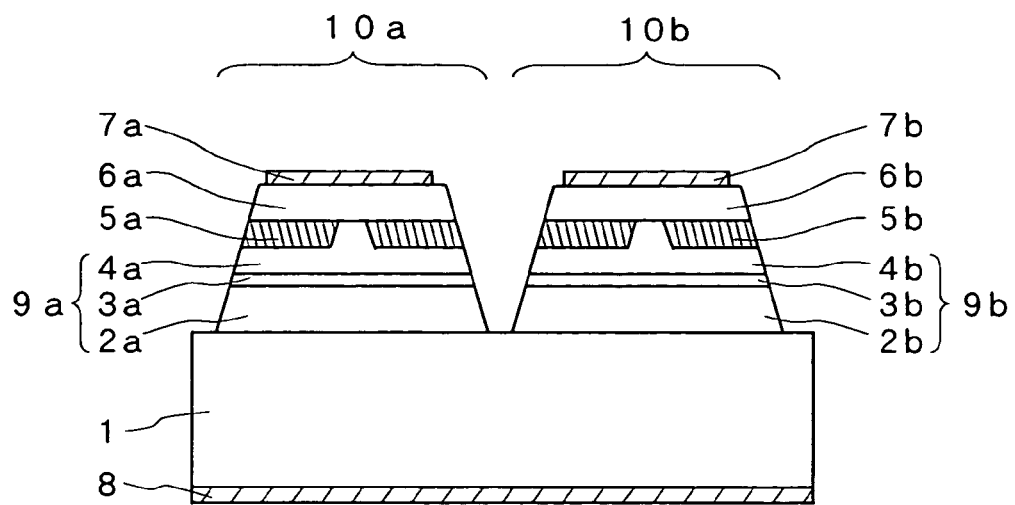
FIG. 1 is an explanatory cross-sectional view showing an embodiment of the monolithic semiconductor laser according to the present invention.

An explanation will be given below of a monolithic semiconductor laser according to the present invention in reference to the drawings. As an explanatory cross-sectional view of an embodiment is shown in FIG. 1, the monolithic semiconductor laser according to the present invention is formed with an AlGaAs based semiconductor laser element 10*a* and an InGaAlP based semiconductor laser element 10*b* which are formed on the same semiconductor substrate 1. The AlGaAs based semiconductor laser element 10*a* is formed, on the substrate 1, with a first wavelength (hereinafter referred to as for infrared or AlGaAs based) light emitting layer forming portion 9a which includes a first conductivity type semiconductor layer (for example, n-type cladding layer 2a), an active layer 3a and a second conductivity type semiconductor layer (for example, p-type cladding layer 4a) formed so as to have a ridge portion, and a current constriction layer 5a for infrared provided, at least, on sides of the ridge portion. The InGaAlP based semiconductor laser element 10b is formed, on a region of the semiconductor substrate 1 where the AlGaAs based semiconductor laser element 10a is not formed, with a second wavelength (hereinafter referred to as for red or InGaAlP based) light emitting layer forming portion 9b which includes a first conductivity type semiconductor layer (for example, n-type cladding layer 2b), an active layer 3b and a second conductivity type semiconductor layer (for example, p-type cladding layer 4b) formed so as to have a ridge portion, and a current constriction layer 5b for red, which is made of the same material as that of the current constriction layer 5a for infrared and has larger band gap energy than that of the active layer 3b, provided, at least, on sides of the ridge portion.

As the semiconductor substrate 1 for laminating these semiconductor layers, a GaAs substrate capable of obtaining lattice matching is usually used, however other compound semiconductor can be used. In addition, as a conductivity type of the semiconductor substrate 1, any one of n-type or p-type conductivity is selected which is required to the substrate side in relation to a set where a semiconductor laser is mounted, and conductivity types of semiconductor layers laminated are decided in accordance with the conductivity type of the substrate 1. In the following concrete examples, an explanation will be given by an example in which the semiconductor substrate 1 has n-type conductivity.

In an example shown in FIG. 1, current constriction layers 5a and 5b for infrared and red light are made of the same material which has larger band gap energy than that of the active layer 3b of the red light emitting layer forming portion 9b, and formed at both sides of the ridge portion of each of the second conductivity type semiconductor layers 4a and 4b, so as to fill the side portions of the ridges.

In such manner, by using the same material for each of current constriction layers, the current constriction layers can be formed by growing simultaneously as described later, and, at the same time, ridge forming processes, removing processes or the like can be commonized, then, lowering of a manufacturing yield can be inhibited. In addition, if a material having larger band gap energy than that of the active layer of the red light emitting layer forming portion is used, the current constriction layer naturally has larger band gap energy than that of the active layer of the infrared light emitting layer forming portion, thereby, both of infrared and red light are not absorbed. Therefore, for both of the red and infrared light, a real (effective) refractive index structure can be realized and a monolithic semiconductor laser with excellent high temperature operation and high output characteristics can be obtained.

Generally, an AlGaAs based material or an InGaAlP based material is used for forming the current constriction layer 5a for infrared and the current constriction layer 5b for red. Here, the AlGaAs based material means a material represented by $Al_zGa_{1-z}As$ ($0 \leq z \leq 1$), and the InGaAlP based material means a material represented by $In_{0.5}(Ga_{1-x}Al_x)_{0.5}P$ ($0 \leq x \leq 1$).

Since each of such materials has a similar lattice constant to that of the substrate, crystal growth thereof is comparatively easy and quality of semiconductor layers can be improved. And, it is preferable to use especially the InGaAlP based material because an effect of current constriction is easily maintained. Namely, with increasing of a ratio of Al in the current constriction layer, a ratio of carbon included in an organic metal of a raw material diffusing into the current constriction layer increases and the current constriction layer becomes to have p-type conductivity. Then, in case of forming an n-type current constriction layer, if the ratio of the Al is not lowered sufficiently, the effect of the current constriction deteriorates and leads to a leakage current or the like because the current constriction layer is apt to approach to p-type conductivity. Therefore, it is more preferable to use the InGaAlP based material which has a low ratio of Al from the aspect of maintaining easily the effect of the current constriction. Furthermore, in order to maintain the effect of the current constriction more surely, it is more preferable to dope Si in case of using an n-type current constriction layer since a sufficient effect of the current constriction can be maintained even if the ratio of Al increases. On the other hands, a p-type layer can be obtained by doping Zn, Mg, Be or the like.

In addition, layers made of n-type GaAs or the like which has a function of adjusting an effect of current constriction or light confinement, or a function of a protection layer, may be laminated on the current constriction layers 5a and 5b for infrared and red light.

In addition, an explanation of a case using the InGaAlP based material or the AlGaAs based material is given here, however, even materials besides these materials can be used if the above-described conditions are satisfied.

As shown in FIG. 1, the infrared and red light emitting layer forming portions 9a and 9b include, at least, first conductivity type semiconductor layers (n-type cladding layers 2a and 2b), active layers 3a and 3b, and second conductivity type semiconductor layers (p-type cladding layers 4a and 4b).

The AlGaAs based material is used in order to form the infrared light emitting layer forming portions 9a and generally, the InGaAlP based material is mainly used in order to form the red light emitting layer forming portions 9b. Other materials may be used for a part of the light emitting layer forming portions for the infrared light and red light. And also, for the first conductivity type semiconductor layers 2a and 2b, buffer layers or the like may be used besides the n-type cladding layers. As to the second conductivity type semiconductor layers 4a and 4b, by dividing each of the p-type cladding layers into two, etching stop layers or the like may be provided therebetween, and a cap layer or the like may be provided on the p-type cladding layer. It is preferable that the active layers 3a and 3b has a quantum well structure because, in case of a structure such that an end surface of a resonator is varied in quality by Zn diffusion or the like (case of having a window structure), varying in quality can not be achieved if the active layers does not have a quantum structure, however, a bulk structure may be allowed. In addition, the quantum well structure may be a single quantum well structure or a multi quantum well structure.

Contact layers 6a and 6b are formed on the light emitting layer forming portions 9a and 9b and the current constriction layers 5a and 5b with, for example, p-type GaAs layers or the like. P-side electrodes 7a and 7b are formed of Ti/Au or the like on surfaces of the contact layers 6a and 6b by a sputtering or vacuum evaporation method. In addition, an n-side electrode 8 is formed of Au—Ge/Ni or the like on a back surface of the substrate 1 which is thinned beforehand. Thickness and material of the layers can be selected properly same as in the prior art.

Figure 2:
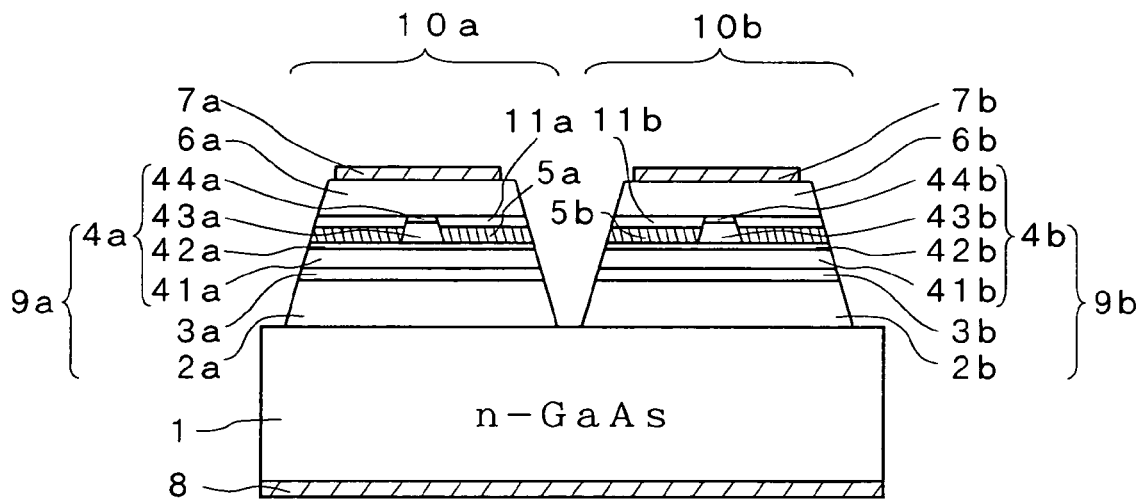
FIG. 2 is an explanatory cross-sectional view showing details of the monolithic semiconductor laser according to the present invention.
Figure 3:
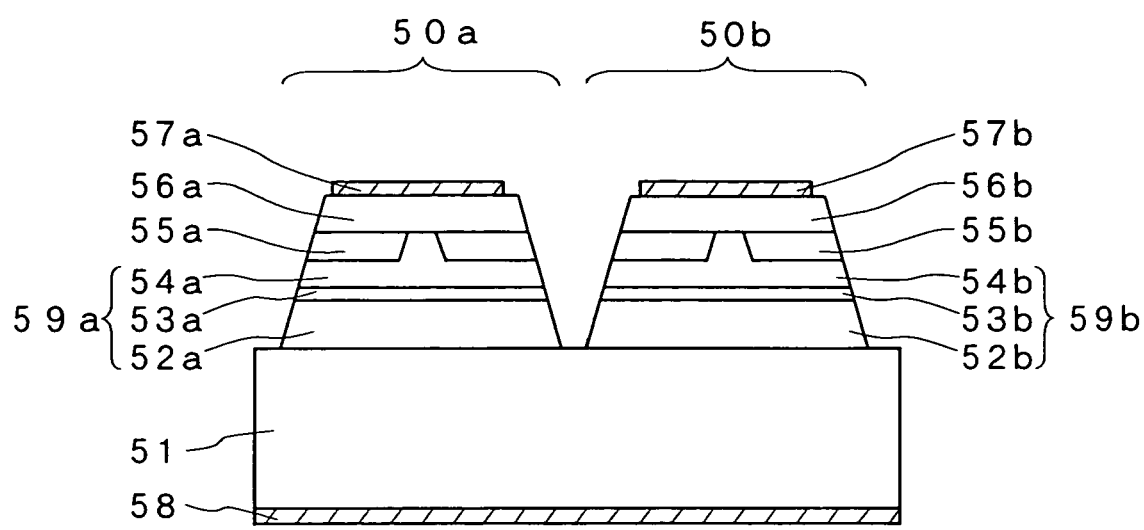
FIG. 3 is an explanatory cross-sectional view showing a monolithic semiconductor laser by the prior art.

A detailed explanation of the above-described constitution will be given below by using FIG. 2. AS shown in FIG. 2, the n-type cladding layer 2a having a thickness of approximately 1 to 10 μm and made of n-type $Al_{z2}Ga_{1-z2}As$ ($0.4 \leq z2 \leq 0.7$, for example z2=0.5) is formed on the n-type GaAs substrate 1, and the active layer 3a having a total thickness of approximately 0.04 to 0.2 μm is formed thereon by a single or multi quantum well structure of a well layer made of $Al_{z3}Ga_{1-z3}As$ ($0.04 \leq z3 \leq 0.2$, for example $z3=0.1$) and a barrier layer made of $Al_{z4}Ga_{1-z4}As$ ($0.1 \leq z4 \leq 0.5$, $z3<z4$, for example $z4=0.3$), not shown in the figure. Then, there are formed a p-type first cladding layer 41a having a thickness of approximately 0.05 to 0.5 μm and made of $Al_{z5}Ga_{1-z5}As$ ($0.4 \leq z5 \leq 0.7$, for example $z5=0.5$) on the active layer, a p-type etching stop layer 42a having a thickness of approximately 0.005 to 0.05 μm and made of $Al_{z6}Ga_{1-z6}As$ ($0 \leq z6 \leq 0.4$, for example $z6=0.2$), a p-type second cladding layer 43a having a thickness of approximately 0.5 to 3 μm and made of $Al_{z7}Ga_{1-z7}As$ ($0.4 \leq z7 \leq 0.7$, for example $z7=0.5$), and a cap layer 44a having a thickness of approximately 0.01 to 0.3 μm and made of p-type GaAs, thereby an infrared light emitting layer forming portion 9a formed with a p-type semiconductor layer 4a with a ridge shape is formed.

On the other hand, the n-type cladding layer 2b having a thickness of approximately 1 to 10 μm and made of $In_{0.5}(Ga_{1-x2}Al_{x2})_{0.5}P$ ($0.3 \leq x2 \leq 0.9$, for example $x2=0.7$) is formed on a region of the n-type GaAs substrate 1 where the infrared light emitting layer forming portion is not formed, and the active layer 3b having a total thickness of approximately 0.04 to 0.2 μm is formed thereon by a single or multi quantum well structure of a compressively strained quantum well layer made of $In_{y3}(Ga_{1-x3}Al_{x3})_{1-y3}P$ ($0 \leq x3 \leq 0.1$, $0 \leq y3 \leq 0.55$, for example $x3=0$, $y3=0.53$), and a barrier layer made of $In_{0.5}(Ga_{1-x4}Al_{x4})_{0.5}P$ ($0.1 \leq x4 \leq 0.5$, for example $x4=0.5$), not shown in the figure. Then, there are formed a p-type first cladding layer 41b having a thickness of approximately 0.05 to 0.5 μm and made of $In_{0.5}(Ga_{1-x5}Al_{x5})_{0.5}P$ ($0.3 \leq x5 \leq 0.9$, for example $x5=0.7$) on the active layer, a p-type etching stop layer 42a having a thickness of approximately 0.005 to 0.05 μm and made of $In_{y6}(Ga_{1-x6}Al_{x6})_{1-y6}P$ ($0 \leq x6 \leq 0.5$, $0 \leq y6 \leq 0.5$, for example $x6=0$ and $y6=0.35$), a p-type second cladding layer 43b having a thickness of approximately 0.5 to 3 μm and made of $In_{0.5}(Ga_{1-x7}Al_{x7})_{0.5}P$ ($0.3 \leq x7 \leq 0.9$, for example $x7=0.7$), and a cap layer 44b having a thickness of approximately 0.01 to 0.3 μm and made of p-type $In_{0.5}(Ga_{1-x8}Al_{x8})_{0.5}P$ ($0 \leq x8 \leq 0.5$, for example $x8=0$) thereon, thereby a red light emitting layer forming portion 9b formed with a p-type semiconductor layer 4b with a ridge shape is formed.

Then, at both sides of each of the p-type second cladding layers 43a and 43b, and the cap layers 44a and 44b, current constriction layers 5a for the infrared light device and 5b for the red light device, having a thickness of for example approximately 0.1 to 3 μm and for example 0.4 μm and made of materials represented by n-type $Al_{z1}Ga_{1-z1}As$ ($0.5 \leq z1 \leq 0.8$, for example $z1=0.6$) or $In_{y1}(Ga_{1-x1}Al_{x1})_{1-y1}P$ ($0.6 \leq x1 \leq 1$, $0 \leq y1 \leq 1$, for example $x1=0.75$ and $y1=0.5$) which is doped with Si, are formed. In addition, on each current constriction layer, protection layers 11a and 11b having a thickness of approximately 0.01 to 3 μm, for example 0.5 μm, and made of n-type GaAs are provided.

Further, contact layers 6a and 6b having a thickness of approximately 0.1 to 10 μm and made of p-type GaAs is provided on the cap layers and the protection layers, p-side electrodes 7a and 7b made of Ti/Au or the like on the contact layers, and the n-side electrode 8 made of Au—Ge/Ni or the like on a back surface of the GaAs substrate 1.

Further, the present inventor actually made prototypes of various monolithic semiconductor lasers with constitutions having current constriction layers. And, in a process of making the prototypes, it was found that selection of a material for the current constriction layers affects high output characteristics. For example, when a material (for example, AlGaAs based material) which has been used for a current constriction layer for infrared in a single AlGaAs based high output semiconductor laser device is used for the current constriction layer 5a for the infrared light as it is, characteristics of the AlGaAs based high output semiconductor laser element 10a can be naturally maintained. However, when the same material is used for the current constriction layer 5b for red, characteristics of an InGaAlP based semiconductor laser element 10b can not always maintain conventional high output characteristics because the material is not the same as that of the conventional current constriction layer (for example, InGaAlP based materials). On the other hand, for example, when a material (for example, InGaAlP based material) which has been used for a conventional InGaAlP based high output semiconductor laser device is used as it is, the characteristics of an InGaAlP based high output semiconductor laser element 10b can be maintained, but the high output characteristics of the AlGaAs based semiconductor laser element 10a occasionally deteriorates because a kink or the like occurs by increase of difference between refractive indices of the ridge portion and the current constriction layer.

As mentioned above, a high output monolithic semiconductor laser device can be realized by using a common material for current constriction layers, however characteristics of one of semiconductor laser elements can not be occasionally maintained depending upon a way of selection, and in order to maintain the characteristics of both semiconductor laser elements, the material for each current constriction layer is necessarily limited.

Then, the present inventor carried out various studies in order to widen a range of materials which can be used for current constriction layers more, while using a common material for the current constriction layers for infrared and red light. In place of a conventional idea such that, in order to inhibit deterioration of characteristics caused by selecting a material for the current constriction layer, a composition or thickness of the current constriction layer is optimized for maintaining the characteristics, an idea was found such that the range of selecting materials can be widened by fixing the composition or thickness of the current constriction layer, and adjusting a composition of the second conductivity type semiconductor layer (cladding layer constituting the ridge portion) adjacent to the current constriction layer, depending on a refractive index of the current constriction layer. Concretely, as a result of various experiments it was found that even if a material for the current constriction layer is changed by using a material which has a refractive index such that the difference between the refractive index of the second conductivity type semiconductor layers and a refractive index of the current constriction layer is 0.1 or less, preferably 0.05, for the second conductivity type semiconductor layers, the characteristics can be maintained sufficiently.

More concretely, in case of using, for example, a conventional InGaAlP based material for the current constriction layers 5a and 5b for infrared and red light, since a refractive index thereof is approximately 3.24 to 3.30, a refractive index of the second conductivity type semiconductor layers 4a and 4b is preferably approximately 3.29 to 3.39 in order to maintain high output characteristics. And, in case of using an AlGaAs based material for the current constriction layers 5a and 5b for infrared and red light, since a refractive index thereof is approximately 3.34 to 3.39, a refractive index of the second conductivity type semiconductor layers is preferably approximately 3.39 to 3.44. In this manner, the characteristics of each of the conventional semiconductor laser elements are not deteriorated, and the high output characteristics of both semiconductor laser elements can be maintained.

Furthermore, when comparing high temperature operation and high output characteristics of the AlGaAs based semiconductor laser element 10a with that of the InGaAlP based semiconductor laser element 10b, since the InGaAlP based semiconductor laser element is generally hard to achieve high output operation, the InGaAlP based semiconductor laser element preferably maintains a conventional constitution as possible. Namely, it is preferable to design so as to form current constriction layers for infrared and red light by using an InGaAlP based material, and maintain the difference of the refractory indices by changing the material for the second conductivity type semiconductor layer 4a of the AlGaAs based semiconductor laser element.

In order to manufacture the semiconductor laser shown in the above-described FIGS. 1 and 2, firstly, for forming an AlGaAs based semiconductor laser element 10a, a light emitting layer forming portion 9a including the active layer 3a is formed on the substrate 1. The infrared light emitting layer forming portion 9a is formed, for example, by setting the n-type GaAs substrate 1 within, for example, a MOCVD (metal organic compound vapor deposition) apparatus, supplying necessary materials such as triethyl gallium (TEG), trimethyl aluminium (TMA), trimethyl indium (TMIn), phosphine ($PH_3$) and arsine ($ASH_3$) as a reaction gas, $SiH_4$ as n-type dopant gas and dimethyl zinc (DMZn), bismethylcyclopentadienyl beryllium $(MeCp)_2Be$ biscyclopentadienyl magnesium ($Cp_2Mg$) as p-type dopant gas or the like depending on a conductivity, type of semiconductor layers, together with hydrogen ($H_2$) as carrier gas, and growing the n-type cladding layer 2a, the active layer 3a having a multi quantum well structure, the p-type first cladding layer 41a, the etching stop layer 42a, the p-type second cladding layer 43a, and the cap layer 44a in order, by epitaxial growth of each of the semiconductor layers at a temperature of approximately 500 to 700° C.

Subsequently, the semiconductor substrate 1 is exposed by removing a part of the infrared light emitting layer forming portion 9a of the AlGaAs based semiconductor laser, which is already laminated at a place where an InGaAlP based semiconductor laser element 10b is planed to be formed, by wet etching using an etchant such as a mixture of sulfuric acid and hydrogen peroxide solution, or the like. Thereafter the GaAs substrate 1 is set within the MOCVD apparatus again, and, in order to form a light emitting layer forming portion 9b of an InGaAlP based semiconductor laser element, there are grown in order the n-type cladding layer 2b, the active layer 3b having a multi quantum well structure, the p-type first cladding layer 41b, the etching stop layer 42b, the p-type second cladding layer 43b and the cap layer 44b, thereby the red light emitting layer forming portion 9b is formed.

Then, the red light emitting layer forming portion 9b laminated on the infrared light emitting layer forming portion 9a is removed by wet etching using an etchant such as hydrochloric acid or the like.

Subsequently, a window structure is formed at end surfaces of the red light emitting layer forming portion 9b. Namely, since a catastrophic optical damage (COD) occurs easily especially at the end surfaces in a red high output semiconductor laser, a structure in which an oscillation at the end surfaces is avoided by forming a Zn diffusion region at the end surfaces of a semiconductor laser chip, which is easily damaged, is generally employed. Therefore, diffusing Zn is carried out to a region where the wafer is cleaved into chips in a state of a semiconductor wafer. Concretely, a Zn diffusion source such as a ZnO layer or the like having a thickness of approximately 50 nm is formed on a region of the red light emitting layer forming portion 9b, where cleavage is carried out, by a sputtering method, and annealing at a temperature of approximately 400 to 700° C. and for approximately 10 to 240 min, or the like is carried out, thereby Zn in the Zn diffusion source reaches an active layer. Thereafter, the ZnO or the like is removed by hydrofluoric acid or the like. AS a result, since the quantum well structure of the active layer is varied in quality at a Zn diffusion region, and band gap energy thereof becomes large, the Zn diffusion region is formed at the end surfaces of a resonator after cleavage, and absorption of light from inside is inhibited at the end surfaces of the resonator, and temperature is prevented from rising up extremely, thereby the COD can be prevented.

In order to form an infrared light emitting layer forming portion 9a, an red light emitting layer forming portion 9b, and ridge portions of each thereof, a mask made of $SiO_2$, $SiN_x$ or the like is formed, for example, by a CVD method or the like, thereafter cap layers 44a and 44b are etched selectively, for example, by dry etching or the like, the p-type second cladding layer 43a of the infrared light emitting layer forming portion is etched by an etchant such as a mixed solution of tartaric acid and hydrogen peroxide solution, and the p-type second cladding layer 43b of the red light emitting layer forming portion is etched by an etchant such as hydrochloric acid or the like, thereby ridge portions having a convex shape are formed. In forming this convex shape, etching may be carried out till the etching stop layer or the active layer. Here, as a method for etching, dry etching may be used besides wet etching.

As described later, since current constriction layers 5a and 5b for the infrared and red light are formed by filling simultaneously, formation of ridge portions can be also carried out by a sequence of processes in a monolithic semiconductor laser by the present invention. Namely, in case of forming each of current constriction layers by using different materials, since the current constriction layers can not be filled simultaneously, ridge portions are required to be formed at different steps for the each, as a former step before growing the current constriction layer. Then, the processes of forming the ridge portions are necessary two times, however in the monolithic semiconductor laser by the present invention, the ridge portions can be formed by continuous processes of one time, and moreover a removing process such as removing unnecessary portions accompanied with a ridge forming process, or the like can be also finished by one time.

Subsequently, the current constriction layers 5a and 5b for infrared and red light are filled simultaneously, at least, at sides of both narrow width portions of the convex shape. Filling (growing) the current constriction layers are carried out by a selective growth using a mask made with an insulating film. The current constriction layers are doped with Si in order to have n-type conductivity, and formed by using an InGaAlP based material so as to lower a ratio of Al as low as possible. In addition, the selective growth is a method, by which only sides of the ridge portion of the convex shape are filled with current constriction layers selectively without forming the current constriction layers for infrared and red light on the mask, and can be carried out by a usual condition such as a growth temperature and pressure or the like.

Thus, since the monolithic semiconductor laser according to the present invention is formed not by combining high output laser elements of a conventional real (effective) refractive index type simply, but by filling the same material for current constriction layers for infrared and red light which does not absorb light emitted in the active layer and, at the same time, enables to grow selectively, a monolithic semiconductor laser capable of high output operation can be obtained without increasing the number of processes of the growth.

Thereafter, the mask made with an insulating film is removed by hydrofluoric acid or the like. Sequently, contact layers 6a and 6b made of, for example, GaAs are formed, thereby the AlGaAs based semiconductor laser element 10a and the InGaAlP based semiconductor laser element 10b are formed. In addition, in order to separate the AlGaAs based semiconductor laser element 10a and the InGaAlP based semiconductor laser element 10b electrically, a region except a dividing region is masked by a photo resist or the like, and the dividing region is etched to the semiconductor substrate by using an etchant such as hydrochloric acid, mixed solution of sulfuric acid and hydrogen peroxide solution, or the like.

Finally, p-side electrodes 7a and 7b respectively made of, for example, Au—Ge/Ni or the like are formed on surfaces of the contact layers 6a and 6b, and the n-side electrode 8 made of Ti/Au or the like is formed on a back surface of the semiconductor substrate 1, by vacuum evaporation or the like. After the formation of the electrodes, the wafer is divided into chips by cleaving or the like, thereby laser chips are formed.

INDUSTRIAL APPLICABILITY

The monolithic semiconductor laser according to the present invention can be used for a pickup light source of an integrated optical disk device composed of a DVD device such as a DVD (digital versatile disk), a DVD-ROM, a data writable DVD-R or the like, and a CD device such as a CD, a CD-ROM, a data writable CD-R or the like.

What is claimed is:

1. A monolithic semiconductor laser comprising:
a semiconductor substrate;
a first wavelength semiconductor laser element provided on the semiconductor substrate, the first wavelength semiconductor laser element comprising a first wavelength light emitting layer forming portion which includes a first conductivity type semiconductor layer, an active layer and a second conductivity type semiconductor layer which is formed so as to have a ridge portion, and a first conductivity type current constriction layer for the first wavelength semiconductor laser element provided on sides of the ridge portion of the second conductivity type semiconductor layer; and
a second wavelength semiconductor laser element provided on a region of the semiconductor substrate, where the first wavelength semiconductor laser element is not formed, the second wavelength semiconductor laser element comprising a second wavelength light emitting layer forming portion which includes a first conductivity type semiconductor layer, an active layer and a second conductivity type semiconductor layer which is formed so as to have a ridge portion, and a first conductivity type current constriction layer for the second wavelength semiconductor laser element provided on sides of the ridge portion of the second conductivity type semiconductor layer,
wherein the current constriction layers for the first and second wavelength semiconductor laser elements are made of the same material represented by $Al_zGa_{1-z}As$ ($0.5 \leq z \leq 0.8$) and the material has larger band gap energy than that of the active layer of the second wavelength semiconductor laser element which emits light of a shorter wavelength than that of the first wavelength semiconductor laser element, and
wherein the second conductivity type semiconductor layers having the ridge portion of the first and second wavelength semiconductor laser elements are made of materials which have a refractive index of 3.39 to 3.44 respectively, such that the difference between the refractive index and a refractive index of the current constriction layers for the first and second wavelength semiconductor laser elements is at most 0.1.

2. A monolithic semiconductor laser comprising:
a semiconductor substrate:
a first wavelength semiconductor laser element provided on the semiconductor substrate, the first wavelength semiconductor laser element comprising a first wavelength light emitting layer forming portion which includes a first conductivity type semiconductor layer, an active layer and a second conductivity type semiconductor layer which is formed so as to have a ridge portion, and a first conductivity type current constriction layer for the first wavelength semiconductor laser element provided on sides of the ridge portion of the second conductivity type semiconductor layer; and
a second wavelength semiconductor laser element provided on a region of the semiconductor substrate, where the first wavelength semiconductor laser element is not formed, the second wavelength semiconductor laser element comprising a second wavelength light emitting layer forming portion which includes a first conductivity type semiconductor layer, an active layer and a second conductivity type semiconductor layer which is formed so as to have a ridge portion, and a first conductivity type current constriction layer for the second wavelength semiconductor laser element provided on sides of the ridge portion of the second conductivity type semiconductor layer,
wherein the current constriction layers for the first and second wavelength semiconductor laser elements are made of the same material represented by $In_{0.5}(Ga_{1-x}Al_x)_{0.5}P$ ($0.6 \leq x \leq 1$) and the material has larger band gap energy than that of the active layer of the second wavelength semiconductor laser element which emits light of a shorter wavelength than that of the first wavelength semiconductor laser element, and
wherein the second conductivity type semiconductor layers having the ridge portion of the first and second wavelength semiconductor laser elements are made of materials which have a refractive index of 3.29 to 3.39 respectively, such that the difference between the refractive index and a refractive index of the current constriction layers for the first and second wavelength semiconductor laser elements is at most 0.1.

3. The monolithic semiconductor laser according to claim 1, wherein protection layers made of GaAs are provided on the current constriction layers.

4. The monolithic semiconductor laser according to claim 3, wherein the current constriction layers for the first and second wavelength semiconductor laser elements are electrically separated and made with an n-type semiconductor layer which is formed by adding Si to the current constriction layer.

5. The monolithic semiconductor laser according to claim 2, wherein protection layers made of GaAs are provided on the current constriction layers.

6. The monolithic semiconductor laser according to claim 5, wherein the current constriction layers for the first and second wavelength semiconductor laser elements are electrically separated and made with an n-type semiconductor layer which is formed by adding Si to the current constriction layer.

* * * * *